United States Patent
Machida et al.

[11] Patent Number: 5,619,345
[45] Date of Patent: Apr. 8, 1997

[54] LINEAR IMAGE SENSOR OF THE CONTACT TYPE

[75] Inventors: Satoshi Machida; Yukito Kawahara; Hiroshi Mukainakano; Masahiro Yokomichi, all of Tokyo, Japan

[73] Assignee: Seiko Instruments Inc., Japan

[21] Appl. No.: 731,741

[22] Filed: Jul. 16, 1991

[30] Foreign Application Priority Data

Jul. 26, 1990 [JP] Japan ................................. 2-198286

[51] Int. Cl.$^6$ ............................................. H04N 1/04
[52] U.S. Cl. ........................... 358/482; 358/483; 358/474; 358/494; 250/208.1
[58] Field of Search ................................. 358/482, 483, 358/484, 474, 476, 494; 250/208.1

[56] References Cited

U.S. PATENT DOCUMENTS

| | | | |
|---|---|---|---|
| 4,652,743 | 3/1987 | Harano et al. | 358/484 |
| 4,692,812 | 9/1987 | Hirahara | 358/483 |
| 4,748,516 | 5/1988 | Harano et al. | 358/476 |
| 4,999,484 | 3/1991 | Kaneko | 250/208.1 |
| 5,063,286 | 11/1991 | Kaneko | 358/494 |

FOREIGN PATENT DOCUMENTS 2110763  6/1972  France.

OTHER PUBLICATIONS

Patent Abstracts of Japan, vol. 10, No. 209 (E–421) (2265) 22 Jul. 1986.
Patent Abstracts of Japan, vol. 6, No. 259 (E–149) 17 Dec. 1982.
Patent Abstracts of Japan, vol. 8, No. 155 (E–256) (1592) 19 Jul. 1984.
IEEE International Solid–State Circuits Conference, 32nd Conf., vol. 28, Feb., 1988, Coral Gables, Florida, USA. Tadashi Aoki et al. (pp. 102–103, 319): "A Collinear 3–Chip Image Sensor".

Primary Examiner—Edward L. Coles, Sr.
Assistant Examiner—T. Stoll
Attorney, Agent, or Firm—Adams & Wilks

[57] ABSTRACT

An image sensor of the contact type is comprised of a plurality of image sensor chips arranged linearly with one another. Each chip has an array of picture elements arranged at a given constant pitch which is set slightly smaller than a standard reading pitch in a main scanning direction, thereby ensuring uniform output performance of the image sensor.

8 Claims, 1 Drawing Sheet

LINEAR IMAGE SENSOR OF THE CONTACT TYPE

BACKGROUND OF THE INVENTION

The present invention relates to a linear image sensor of the contact type used in an image scanner, a facsimile machine, etc.

There is known an image sensor of the contact type comprised of a plurality of image sensor chips arranged linearly with one another. FIG. 3 is a plan view of an example of such a contact type linear image sensor. A plurality of image sensor chips 21 are arranged linearly on a base plate 11. FIG. 4 shows a plan view of one image sensor chip 21. The chip 21 is provided with a linear array of picture elements 31 arranged such that an end element is spaced an interval b from an inner adjacent element and the remaining intermediate elements are spaced an interval a from each other. The end interval b is set smaller than the intermediate interval a. Further, the intermediate interval a is set exactly identical to a given standard reading pitch of the sensor in the horizontal or main scanning direction. The image sensor chip 21 is comprised of a semiconductor IC, and each picture element 31 has a light receiving region composed of a diffusion layer having one conductivity type opposite to that of a semiconductor substrate of the IC chip. The end interval b is set smaller than the intermediate interval a in order to compensate for a gap between adjacent image sensor chips 21 to maintain overall regularlity of the standard reading pitch.

If an end element 31 were disposed too closely to an edge of the chip with the regular interval a, there would be caused a drawback that leakage current would flow excessively between the light receiving diffusion layer and the semiconductor substrate.

However, the above noted conventional image sensor of the contact type has a drawback that the output level of the end picture element is varied relative to the remaining intermediate elements. Namely, since the end interval b between the end element and the inner adjacent element is set smaller than the intermediate interval a of the remaining elements, the electrode pattern layout around the end element is different from those around the remaining elements. Stated otherwise, there is caused a parasitic capacitance variation between a signal electrode pattern around an individual picture element and a light receiving region, thereby generating nonuniform outputs. It would be quite difficult to compensate for such variation provisionally by pattern design.

SUMMARY OF THE INVENTION

An object of the present invention is to eliminate the drawback of the prior art and provide an improved image sensor of the contact type having uniform output performance. In order to achieve the above noted object, according to the invention, an end picture element is spaced from an inner adjacent element a pitch identical to a given constant intermediate pitch a' of the remaining elements, which is set slightly smaller than a standard reading pitch a of the horizontal or main scanning direction so that the electrode pattern layout is commonly set around every picture element, thereby ensuring uniform output performance of the contact type image sensor.

In the contact type image sensor constructed as described above, the end picture element has therearound a pattern layout which is identical to those around the remaining elements so that the end element can produce an output in a uniform manner with the remaining elements. Consequently, there can be obtained the contact type image sensor having uniform output performance.

Further, the contact pitch a' may be set to satisfy the relation $n(a-a')<a$ where n denotes the number of picture elements contained in one image sensor chip along the horizontal scanning direction, in order to limit a total dimensional error of the picture element array within a scale of one standard reading pitch to substantially eliminate horizontal distortion of a read image relative to an original image.

DETAILED DESCRIPTION OF THE INVENTION

Figure 1:
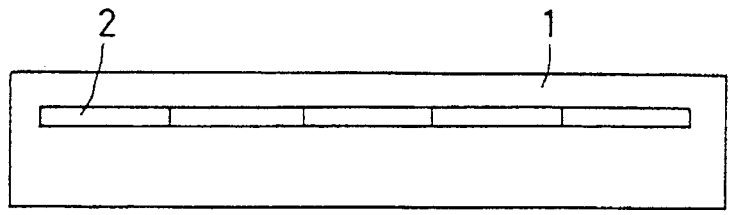
FIG. 1 is a plan view showing one embodiment of the inventive image sensor of the contact type.

Hereinafter, one embodiment of the invention will be described in conjunction with the drawings. FIG. 1 is a plan view of the inventive image sensor of the contact type. A plurality of image sensor chips 2 are arranged linearly on a base plate or member 1. Adjacent image sensor chips 2 are disposed closely at a gap f less than several tens μm.

Figure 2:
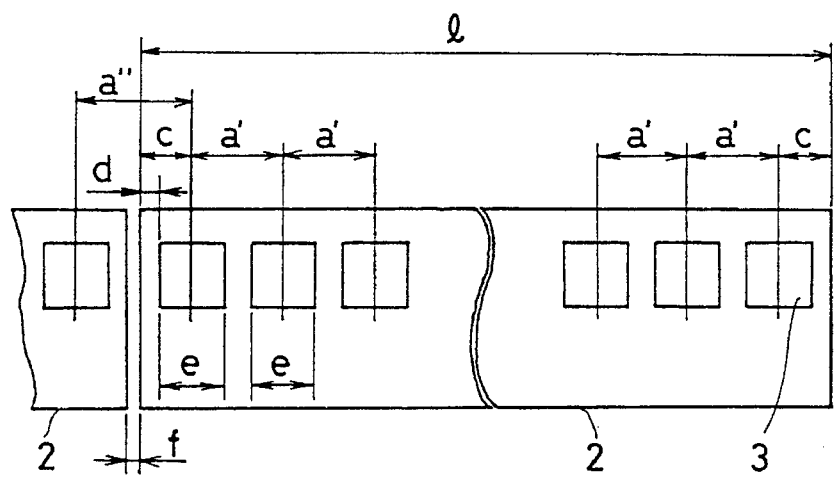
FIG. 2 is a plan view showing an image sensor chip contained in the inventive image sensor of the contact type.
Figure 3:
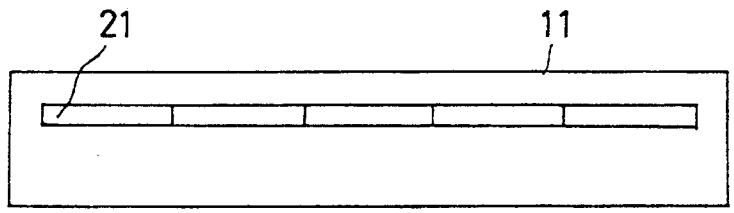
FIG. 3 is a plan view of the conventional image sensor of the contact type.
Figure 4:
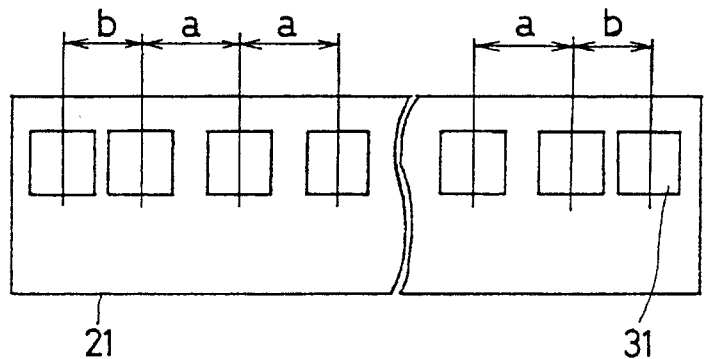
FIG. 4 is a plan view of an image sensor chip contained in the conventional image sensor of the contact type.

FIG. 2 shows an enlarged plan view of one image sensor chip 2. The chip 2 has an array of n pieces of picture elements 3 arranged linearly in a main or horizontal scanning direction. The picture elements 3 are disposed in end-to-end relation at a given constant interval or pitch a' throughout the entire of the array. The pitch a' is set slightly smaller than a standard reading pitch a of the horizontal scanning direction, which is calculated by dividing a span of the liner sensor by the total number of picture elements. Further, local lead electrode patterns are designed identically in and around all the picture elements 3 including the end ones, thereby avoiding nonuniform variation of outputs at a particular element within the same image sensor chip 2, for example, at opposite end elements. Such variation would be caused by differences in local lead electrode pattern layouts. Moreover, the linear arrangement pitch a' is preferably set to satisfy the following relation (1):

$$n(a-a')<a \tag{1}$$

By such arrangement, the total positional error of the picture elements can be limited below an order of one standard pitch a within one chip. For example, if each sensor image chip array has a 16 dots/mm of image reading resolution and n=128 number of picture elements, the standard reading pitch a is calculated to 1 mm/16=62.5 μm and the arrangement pitch a' should be no less than 62.012 μm according to the relation (1). Thus, the pitch a' is set to 62.1 μm in this embodiment.

On the other hand, a reading span of 128 dots is calculated to 128÷16=8 mm, hence the chip length l should be less than 8 mm to leave a gap between adjacent chips. Though depending on the mounting accuracy of the chips, the gap f between adjacent chips is, for example, estimated to 20 μm. In such case, the chip length l should be set to l=8000−20=

7980 μm in order to accurately mount linearly the chips to match with the given standard reading pitch.

As indicated in FIG. 2, a distance c from a center of the end picture element to the chip edge is represented by the following relation (2):

$$c=l-(n-1)a'/2 \qquad (2)$$

The specific values are introduced into the relation (2) to calculate the distance c=46.65 μm. Further, a distance d between the chip edge and an outer border of the light receiving region of the end picture element is set to, for example, d=25 μm in view of a normal cutting work accuracy. In such case, a width e of the picture element is set to e=2(c−d)=43.3 μm. Accordingly, a sufficient light receiving area can be obtained effectively. In addition, an interval a″ of opposed end picture elements between adjacent chips 2 is set to a″=2c+f=113.3 μm. This value is greater than the standard reading pitch a=62.5 μm by about 80/. Generally, a dimensional error of more or less one picture element order does not affect quality of a reproduced image in case of 16 dots/mm of the resolution. Aside from the above, the actual pitch arrangement may be locally widened exceptionally at one or more intermediate spots, relative to the constant pitch value a' in view of optimum and efficient lead pattern layout. However, in such case, the constant pitch a' is maintained for almost all of the picture elements including the end ones, thereby maintaining uniform quality of a reproduced image. The present invention can be applied not only to an image sensor having a single line of picture elements, but also to those having multiple lines of picture elements.

As described above, according to the present invention, there can be obtained a linear image sensor of the contact type having uniform output performance with simplified construction.

What is claimed is:

1. An image sensor of the contact type, comprising:

a base plate; and a plurality of image sensor chips disposed on the base plate and arranged linearly with one another in a main scanning direction so as to read an image by a given standard reading pitch a, each image sensor chip having an array of picture elements arranged linearly in the main scanning direction, and all the picture elements including the picture elements at opposed ends of each chip being arranged at a given constant pitch a' which is set slightly smaller than the standard reading pitch a.

2. An image sensor of the contact type according to claim 1; wherein the array of picture elements has a constant pitch a' set to satisfy the relation n(a−a')<a, where n indicates a number of picture elements arranged in the main scanning direction of each chip.

3. An image sensor of the contact type, comprising: a base member; and a plurality of image sensor chips having opposed ends and being linearly disposed in end-to-end relation on the base member, each image sensor chip having an array of picture elements linearly spaced apart from one another, and all the picture elements of each chip including the endmost picture elements at opposed ends of the chip being linearly spaced at a predetermined constant pitch which is less than a standard reading pitch determined by dividing the length of the chip between the opposed ends thereof by the total number of picture elements.

4. An image sensor according to claim 3; wherein the array of picture elements satisfy the relation $$n(a-a')<a$$

where n is the total number of picture elements, a is the standard reading pitch, and a' is the predetermined constant pitch.

5. An image sensor according to claim 4; wherein the picture elements of each chip have the same size and shape.

6. An image sensor according to claim 4; wherein the standard reading pitch is 62.5 μm.

7. An image sensor according to claim 3; wherein the picture elements of each chip have the same size and shape.

8. An image sensor according to claim 3; wherein the standard reading pitch is 62.5 μm.

* * * * *